United States Patent
Kim et al.

(10) Patent No.: US 6,473,346 B1
(45) Date of Patent: Oct. 29, 2002

(54) SELF BURN-IN CIRCUIT FOR SEMICONDUCTOR MEMORY

(75) Inventors: Sam-Soo Kim, Seoul (KR); Young-Hyun Jun, Seoul (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 08/587,746

(22) Filed: Jan. 19, 1996

(30) Foreign Application Priority Data

Dec. 26, 1995 (KR) .......................................... 95-0056430

(51) Int. Cl.[7] ................................................ G11C 7/00
(52) U.S. Cl. ................................... 365/201; 365/189.07
(58) Field of Search ............................ 365/201, 189.07, 365/193, 236, 191, 233; 371/21.1

(56) References Cited

U.S. PATENT DOCUMENTS 5,321,653 A * 6/1994 Suh et al. ............ 365/189.11 X
5,452,253 A * 9/1995 Choi .................. 365/189.09 X
5,471,429 A * 11/1995 Lee et al. .................... 365/201
5,537,537 A * 7/1996 Fujikawa et al. ....... 365/201 X

* cited by examiner

Primary Examiner—A. Zarabian
(74) Attorney, Agent, or Firm—Fleshner & Kim, LLP

(57) ABSTRACT

An improved self burn-in circuit for a semiconductor memory generates a control signal, an address, and a test data for a burn-in test operation when a certain self burn-in test condition is satisfied. The burn-in circuit includes a burn-in detector for generating a control signal, an address signal, and a test data for a burn-in test operation when a self burn-in test condition is achieved. A memory array performs a burn-in test operation when the test data is written into and/or read from a memory cell which is selected by the address signal in accordance with the control signal.

17 Claims, 3 Drawing Sheets

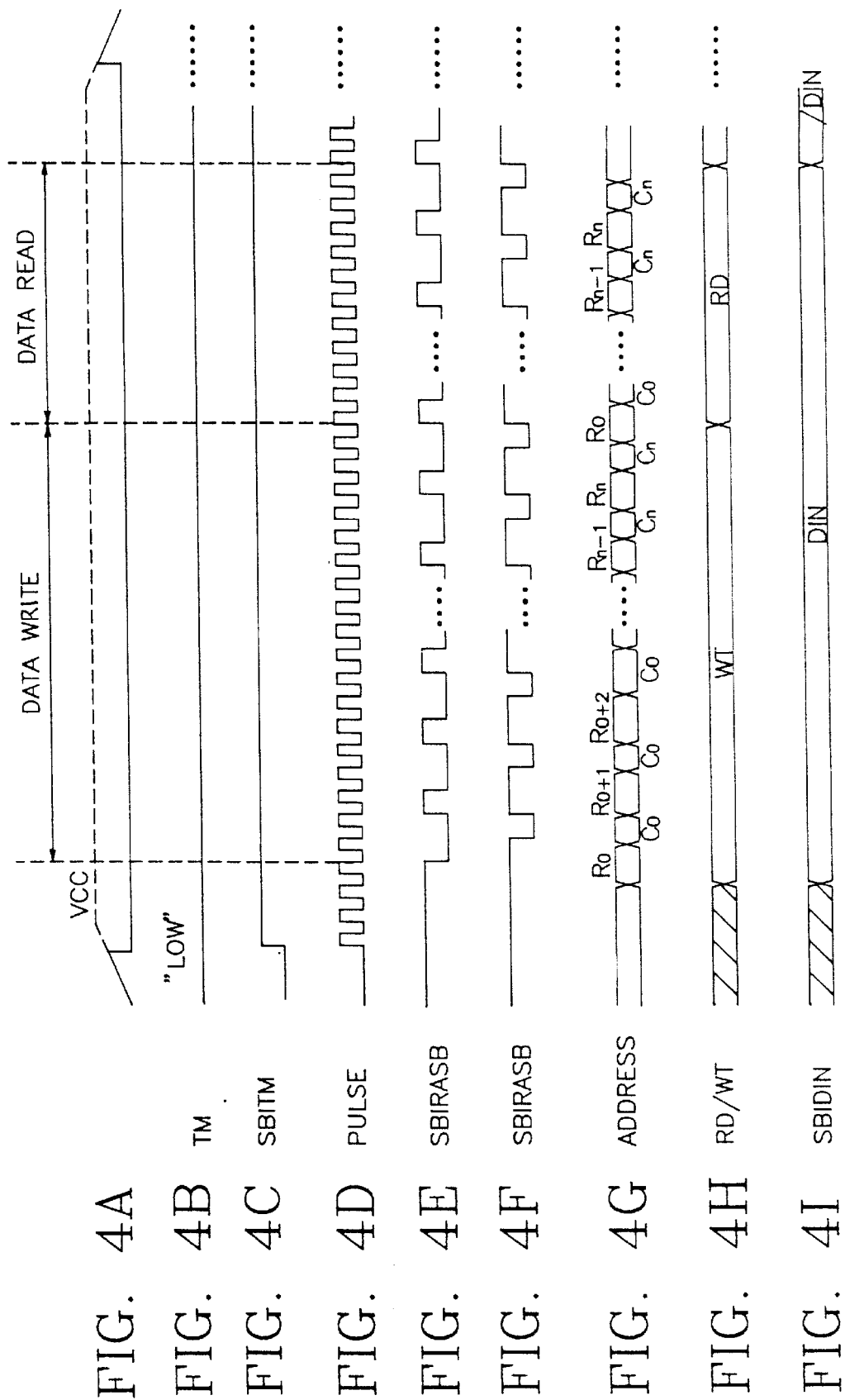

SELF BURN-IN CIRCUIT FOR SEMICONDUCTOR MEMORY

BACKGROUND OF THE INVENTION

1. Field of the Invention

The present invention relates to a self burn-in circuit for semiconductor memory, and in particular to an improved self burn-in circuit for a semiconductor memory capable of generating a control signal, an address, and a test data from the interior of a chip for a burn-in test operation when a certain self burn-in test condition is satisfied.

2. Description of the Conventional Art

Generally, as well known to those who skilled in the art, the burn-in test is referred to a process for testing chip by applying a certain level voltage higher than that of a normal voltage so that an initial error of chip can effectively checked for a relatively short time. However, in order to prevent the reliability decrease of the product in accordance with a fineness of chip and to implement a low voltage consumption, an internal power generator is provided, so that the device of the chip can be driven by voltage lower than an externally supplied voltage. The internal voltage generator has a characteristic of maintaining a constant level of voltage irrespective of variation of an externally supplied voltage in a normal operation interval so as to secure chip reliability and stable operation. Therefore, a certain voltage higher than that of the normal operation should be applied to the entire devices of the chip. Therefore, an externally supplied voltage enters a burn-in test interval beyond the normal operation interval, the internal voltage generator maintaining a constant voltage should generate voltage proportional to the variation of the externally supplied voltage. That is, in case that the level of the externally supplied voltage applied to the chip is beyond the normal operation interval and approaches a burn-in start voltage, the burn-in circuit detects the above-mentioned state and converts the operation state of the chip into a burn-in test mode. In addition, in case that the externally supplied voltage is converted into the normal operation state, the burn-in circuit acts as a role of converting the operation state of the chip into the normal operation mode.

As described above, the conventional burn-in circuit for testing a burn-in test is directed to detecting a start of the burn-in operation when an externally supplied voltage is increased up to a certain level by providing a burn-in detection unit and to performing a cell aging operation by receiving a test data so as to test the operation the cell for selecting a control signal and a cell array from the outside of the system.

However, the conventional burn-in circuit for a burn-in test has disadvantages in that in a state that the memory chip is connected to the burn-in test apparatus, since a control signal, an address and a test data outputted from the burn-in test apparatus is provided to the chip, the test board becomes complicated due to lines for receiving and transmitting signals, so that the number of chips available is limited, and the test process becomes complicated.

SUMMARY OF THE INVENTION

Accordingly, it is an object of the present invention to provide a self burn-in circuit for a semiconductor memory, which overcome the problems encountered in a conventional self burn-in circuit for a semiconductor memory.

It is another object of the present invention to provide an improved self burn-in circuit for a semiconductor memory capable of generating a control signal, an address, and a test data from the interior of a chip for a burn-in test operation when a certain self burn-in test condition is satisfied.

To achieve the above objects, there is provided a self burn-in circuit for a semiconductor memory, which includes a burn-in detector for generating a certain control signal, an address signal, and a test data for a burn-in test operation when a certain self burn-in test condition is achieved; and a memory array for performing a burn-in test operation when said test data is written on/read from a memory cell which is selected by said address signal in accordance with said control signal.

BRIEF DESCRIPTION OF THE DRAWINGS

FIGS. 4A through 4I are views showing a timing of a signal outputted from each element of FIG. 1 according to the present invention.

DETAILED DESCRIPTION OF THE INVENTION

Figure 1:
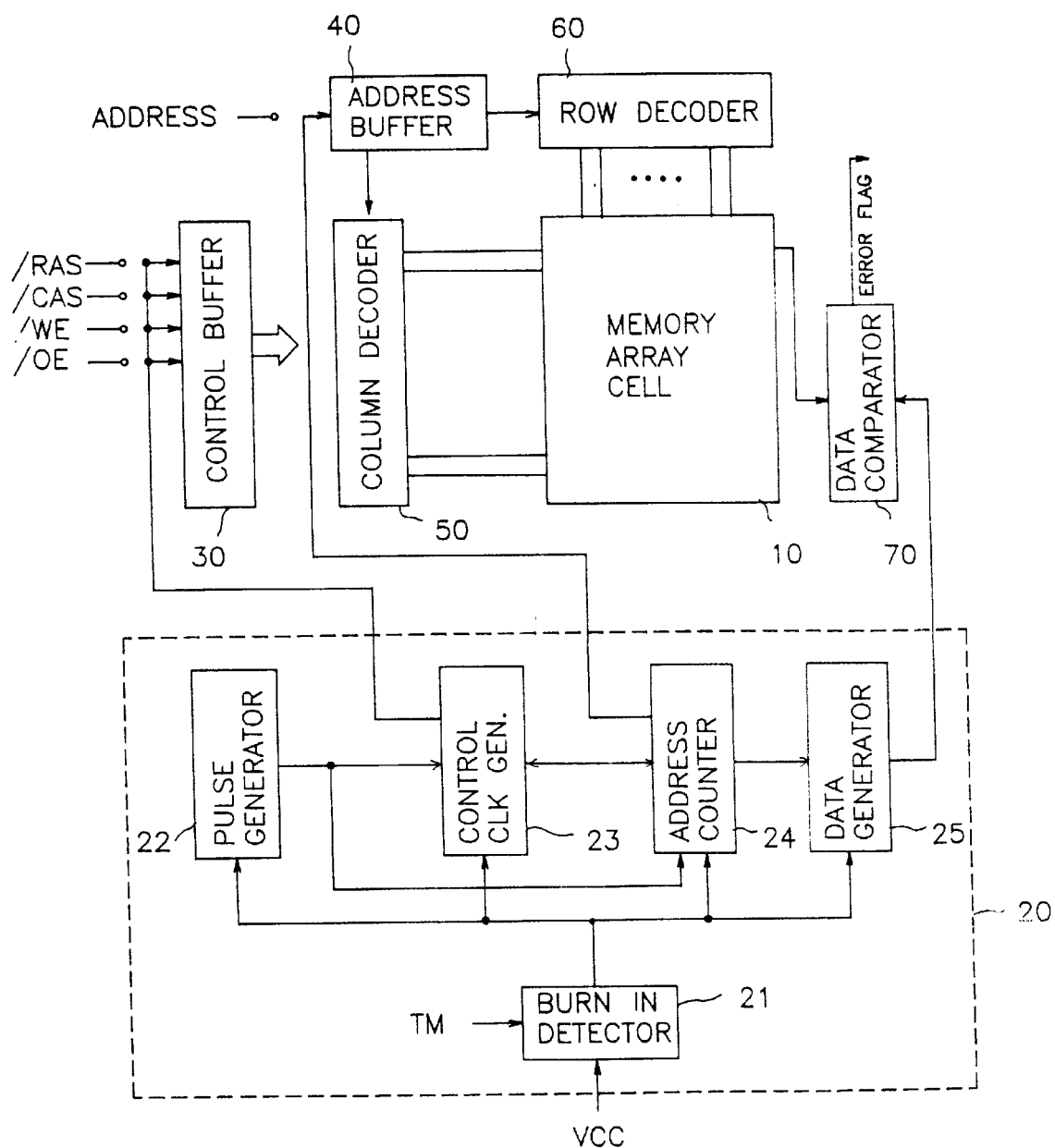
FIG. 1 is a block diagram of a self burn-in circuit for a semiconductor memory according to the present invention.
Figure 2:
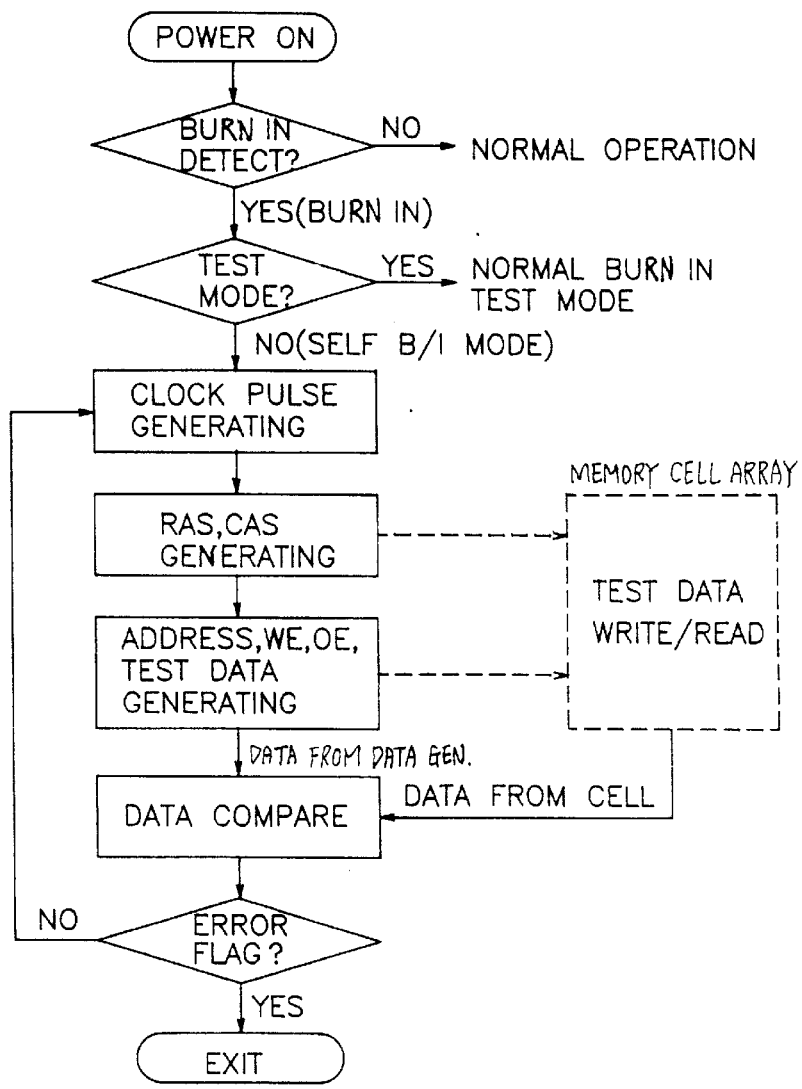
FIG. 2 is a flow chart of an operation of a self burn-in circuit for a semiconductor memory according to the present invention.

FIG. 1 shows a self burn-in circuit for a semiconductor memory of the present invention, which includes a memory cell array 10, a burn-in detector 20 for outputting a self burn-in test control signal, an address, and a test data when a burn-in test mode signal TM is not inputted thereto which indicates a general burn-in test operation in a state that the externally supplied voltage is increased up to a certain level, a control signal buffer 30 for buffering a control signal outputted from the burn-in detector 20, an address buffer 40 for buffering an address outputted from the burn-in detector 20, a column decoder 50 and a row decoder 60 for decoding an address outputted from the address buffer 40 in accordance with a control signal outputted from the control signal buffer 30 and for selecting word line and a bit line of the memory cell array 10, and a data comparator 70 for comparing the data outputted from the memory cell array 10 with the data outputted from the burn-in detector 20.

Here, the burn-in detector 20 includes a burn-in detector 21 for outputting a self burn-in test signal SBITM for the burn-in test when a test mode signal TM which indicates a burn-in test operation is not inputted thereto in a state that an externally supplied voltage is increased up to a certain level, a pulse generator 22 for outputting a clock signal having a certain cycle in accordance with a self burn-in test signal outputted from the burn-in detector 21, a control signal generator 23 for generating a row address strobe (RAS) and a column address strobe (CAS) using a clock pulse in accordance with a self burn-in test signal and for outputting write/read enable signals WE and OE using an address of an address counter 24, an address counter 24 for generating an address using a clock pulse in accordance with a self burn-in test signal and for synchronizing the generated address to the RAS and CAS, and a data generator 25 for reading a test data from the address and for outputting the read data to the data comparator 70 in accordance with a self burn-in test signal.

The operation and effects of the self burn-in circuit for a semiconductor memory of the present invention will now be explained with reference to the accompanying drawings.

To begin with, when a certain voltage is applied to the system, the burn-in detector 21 detects whether voltage Vcc is increased up to a certain level. The burn-in detector 21 judges as a burn-in mode for a burn-in test when the level of the voltage Vcc is increased up to a certain level, and otherwise judges as a normal operation mode. Therefore, when the burn-in detector 21 detects a burn-in mode, the burn-in related operations are performed, and otherwise a normal operation mode is performed. Thereafter, the burn-in detector 21 judges whether a burn-in test operation mode is externally supplied. When the test mode signal TM indicating a general burn-in test operation is inputted from the outside, the burn-in detector 21 performs a certain process same as the prior art, and otherwise the burn-in detector 21 generates a self burn-in test signal SBITM for a self burn-in test operation.

Figure 3:
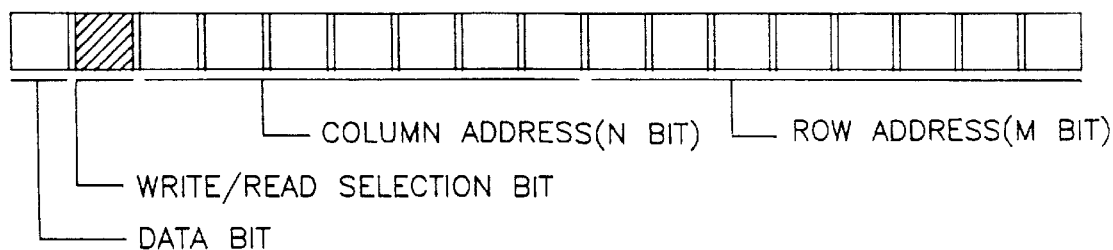
FIG. 3 is a view showing an address and test data format of FIG. 1 according to the present invention.

When the burn-in detector 21 outputs a self burn-in test signal SBITM, the pulse generator 22 outputs a clock pulse having a constant cycle in cooperation with an oscillator or the like. Thereafter, the control signal generator 23 is enabled in accordance with a self burn-in test signal and divides the clock pulse into a certain cycle and outputs a self burn-in test RAS and CAS and outputs to the control signal buffer 30. In addition, the address counter 24 is enabled by a self burn-in test signal SBITM and outputs an M-bit low address and an N-bit column address in accordance with a clock pulse applied thereto. The forms of the low address and column address as shown in FIG. 3 consist of the M- and N-bits, respectively. There are provided write/read selection bits which indicate a separation between the write operation and the read operation at an upper portion of the M- and N-bit address, and the test data written to and read from a certain cell selected in accordance with M- and N-bits addresses is occupied at a most significant bit. The thusly formed address is synchronized with RAS and CAS outputted from the control signal generator 23 and outputted to the address buffer 40. In addition, the control signal generator 23 outputs a write enable signal WE and a lead enable signal OE in accordance with a write/read selection bit of the address and outputs to the control signal buffer 30.

Thereafter, the control signal buffer 30 outputs the RAS, CAS and the write enable signal WE outputted from, the control signal generator 23 to the column decoder 50 and the row decoder 60, respectively, and the address buffer 40 outputs the address and the test data outputted from the address counter 24 to the column decoder 50 and the row decoder 60, respectively. Therefore, the column decoder 50 and the row decoder 60 decode the row address and the column address in accordance with a control signal and select a corresponding cell of the memory cell array 10, and writes a test data to the corresponding cell. When the test data are written on the corresponding entire cells, the thusly written test data are read in accordance with a control of the read enable signal OE outputted from the control signal generator 23 and outputted to the data comparator 70. The data comparator 70 compares the test data outputted from the cells of the memory cell array 10 with the test data outputted from the data generator 25. Here, the data generator 25 reads the test data contained in the MSB (most significant bit) of the address and outputs to the data comparator 70. As a result of the comparison, when two data are the same, it is judged that the corresponding cell is normal, and otherwise, it is judged that the corresponding cell has errors and outputs an error flag. Therefore, in the present invention, RAS, CAS, the write enable signal WE, the lead enable signal OE, and the address, which are applied from the externally connected test apparatus, are generated by the burn-in detector 20.

FIGS. 4A through 4I show timings of each signal related to the self burn-in operation. FIG. 4A shows voltage Vcc applied to the burn-in detector 21. As shown therein, when the voltage Vcc exceeds a certain level, the burn-in detector 21 is recognized that it is a burn-in mode. In addition, the burn-in detector 21 checks whether a test mode signal TM is externally applied. When the externally applied test mode signal TM is a low level as shown in FIG. 4B, the burn-in detector 21 outputs a self burn-in test signal SBITM as shown in FIG. 4C. Therefore, the pulse generator 22 is enabled in accordance with a self burn-in test signal SBITM and generates a certain clock pulse as shown in FIG. 4D. In addition, the control signal generator 23 is enabled in accordance with a self burn-in test signal SBITM and divides the clock pulse into a certain ratio and outputs self burn-in test RAS signal SBIRASB and CAS signal SBI-CASB as shown in FIGS. 4E and 4F. The address counter 24 is enabled in accordance with a self burn-in test signal SBITM and divides the clock pulse into a certain ratio and outputs an address as shown in FIG. 4G, and the thusly outputted address is synchronized with the self burn-in RAS SBIRASB and CAS SBICASB and outputted. In addition, the address is directed to changing the row address in order with respect to one column address, and all of the cells with respect to the corresponding column address is selected. When a certain cell with respect to one column address is selected, the next cell with the respect to a certain column address is selected. That is, all of the cells are selected in the above-mentioned method. When the test data SBIDin are written with respect to all of the cells of the memory cell array 10, a data reading operation with respect to the thusly written data is performed as shown in FIG. 4H. The time that the test data is written/read is determined as the control signal generator 23 reads the write/read selection bit from the address outputted from the address counter 24. While the test data is written on/read from the mode cell of the memory cell array 23, the test data SBIDin outputted from the data generator 25 retains the data form as shown in FIG. 4I because the above-mentioned written test data is read at a read cycle, and because the initial test data is compared . In addition, after the test data SBIDin is written on/read from all of the cells, the data bit value of the address is varied between zero and one (1). In the next burn-in operation, the previous value and the inverted data are written and read in the above-mentioned method.

As described above, the self burn-in circuit for a semiconductor memory according to the present invention is directed to effectively adapting an application specific memory (ASM) to a burn-in test operation so that the self burn-in test is performed by itself in case that an externally supplied voltage exceeds a certain level and the burn-in test operation is not forcibly performed. In addition, since various control signals which are necessary for the common burn-in test process are generated in the chip, it is possible to reduce burn-in test time in the common burn-in test operation which is forcibly performed. In addition, it is possible to increase the number of chips which are tested at one time.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:
1. A self burn-in circuit for a semiconductor memory, comprising:

a burn-in detector circuit for generating a control signal, an address signal, and a test data for a burn-in test operation when said burn-in detector circuit detects a burn-in test condition; and a memory array for performing the burn-in test operation when said test data is at least one of written into and read from a memory cell which is selected by said address signal in accordance with said control signal, wherein said self burn-in circuit further includes a data comparator for comparing a test data read from said memory array with the test data outputted from said burn-in detector circuit, and wherein said burn-in detector circuit includes:

a burn-in detector for generating a self burn-in test signal when the burn-in test condition is detected, a pulse generator for generating a clock pulse in accordance with the self burn-in test signal applied thereto, an address counter for generating the address signal using a clock pulse in accordance with the self burn-in test signal applied thereto, a control signal generator for generating RAS, CAS, write enable signal and read enable signal using the clock pulse signal and the address signal in accordance with the self burn-in test signal applied thereto, and a data generator for reading the test data from the address signal and for outputting the read data to the data comparator in accordance with the self burn-in test signal from said burn-in detector.

2. The circuit of claim 1, wherein a most significant bit and a bit after the most significant bit of said address signal includes a test data and at least one write and read selection bit.

3. The circuit of claim 2, wherein said at least one of said write and read selection bit is directed to determining a timing that the test data is at least one of written into and read from the memory array.

4. The circuit of claim 2, wherein when the test data which is generated by said data generator is repeatedly written into and read from the memory array.

5. The circuit of claim 1, wherein said address is enabled and outputted in accordance with said RAS and said CAS.

6. A memory device comprising:

a memory array having a plurality of memory cells;

means for at least one of reading data from and writing data into each memory cell of said memory array;

a burn-in detector circuit for detecting a burn-in test operation, said burn-in detector circuit generating an address signal which is applied to said means for at least one of reading data from and writing data into a memory cell corresponding to said address signal when said burn-in test operation is detected, wherein said burn-in detector circuit includes:

a burn-in detector detecting the burn-in test operation and generating a burn-in test signal, a pulse generator for generating a clock signal, and an address counter coupled to said burn-in detector and said pulse generator such that said address counter generates said address signal.

7. The memory device of claim 6, further comprising a first buffer for storing said address signal generated by said burn-in detector circuit.

8. The memory device of claim 6, wherein said burn-in detector circuit further generates a plurality of control signals for controlling said means when said burn-in test condition is detected.

9. The memory device of claim 8, further comprising a second buffer for storing said plurality of control signals generated by said burn-in detector circuit when said burn-in test operation is detected.

10. The memory device of claim 6, wherein said burn-in detector circuit further generates test data which is written into said memory array when said burn-in test operation is detected.

11. The memory device of claim 10, further comprising a data comparator which compares data outputted from said memory array with said test data generated by said burn-in detector circuit.

12. The memory device of claim 6, wherein said address counter also generates said test data.

13. The memory device of claim 6, wherein said burn-in test detector further comprises a control generator coupled to said pulse generator, said address counter and said burn-in detector such that said control generator generates at least one of write and read control signals to said means.

14. The memory device of claim 13, wherein said address counter further generates at least one of read and write selection signals which is provided to said control generator.

15. The memory device of claim 6, wherein said burn-in detector circuit further comprises a data generator coupled to said address counter and said burn-in detector, said data generator generating test data used for comparison with data read from said memory array.

16. The memory device of claim 6, wherein said burn-in detector circuit further comprises:

a control signal generator coupled to said pulse generator, said address counter and said burn-in detector such that said control signal generator generates at least one of write and read control signals to said means; and a data detector coupled to said address counter and said burn-in detector, said data generator generating test data used for comparison with data read from said memory array.

17. The memory device of claim 16, wherein said address counter provides said test data for said data generator to generate said test data for comparison with data read from said memory array, and said address counter further generates at least one of read and write selection signal, which is provided to said control signal generator to control an operation of said memory array.

* * * * *